US012336099B2

(12) United States Patent
Guo

(10) Patent No.: US 12,336,099 B2
(45) Date of Patent: Jun. 17, 2025

(54) DISPLAY PANEL, DISPLAY DEVICE, AND DRIVER CHIP

(71) Applicant: Wuhan China Star Optoelectronics Technology Co., Ltd., Wuhan (CN)

(72) Inventor: Yiyu Guo, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 17/610,710

(22) PCT Filed: Jul. 26, 2021

(86) PCT No.: PCT/CN2021/108466
§ 371 (c)(1),
(2) Date: Nov. 12, 2021

(87) PCT Pub. No.: WO2022/262079
PCT Pub. Date: Dec. 22, 2022

(65) Prior Publication Data
US 2024/0422909 A1    Dec. 19, 2024

(30) Foreign Application Priority Data

Jun. 17, 2021    (CN) .......................... 202110676723.3

(51) Int. Cl.
*H05K 1/00* (2006.01)
*H05K 1/11* (2006.01)

(52) U.S. Cl.
CPC ... *H05K 1/118* (2013.01); *H05K 2201/09418* (2013.01); *H05K 2201/10128* (2013.01)

(58) Field of Classification Search
CPC ......... H05K 1/118; H05K 2201/09418; H05K 2201/10128
See application file for complete search history.

(56) References Cited

U.S. PATENT DOCUMENTS

2020/0355972 A1    11/2020    Jian et al.

FOREIGN PATENT DOCUMENTS

| CN | 210181359 U | 3/2020 |
|---|---|---|
| CN | 110993676 A | 4/2020 |
| CN | 111383554 A | 7/2020 |
| CN | 111653200 A | 9/2020 |
| CN | 111916019 A | 11/2020 |

(Continued)

OTHER PUBLICATIONS

CN 111383554 B (Year: 2020).*

(Continued)

*Primary Examiner* — Pete T Lee
(74) *Attorney, Agent, or Firm* — Nathan & Associates Patent Agents Ltd.; Menachem Nathan

(57) ABSTRACT

A display panel, display device, and driver chip are provided. A non-display area of the display panel comprises a bonding area comprising a first bonding area. The first bonding area comprises a horizontal bonding area and a first oblique bonding area comprising a first end and a second end. A distance from the second end to the display area is greater than a distance from the first end to the display area of the display panel. A plurality of bonding terminal groups of the first oblique bonding area are arranged in a stepped-shape manner at equal intervals or unequal intervals.

18 Claims, 5 Drawing Sheets

(56) References Cited

FOREIGN PATENT DOCUMENTS

| CN | 112150933 A | 12/2020 |
|----|-------------|---------|
| KR | 20030049646 A | 6/2003 |
| KR | 20080049912 A | 6/2008 |

OTHER PUBLICATIONS

International Search Report in International application No. PCT/CN2021/108466,mailed on Mar. 14, 2022.
Written Opinion of the International Search Authority in International application No. PCT/CN2021/108466,mailed on Mar. 14, 2022.
Chinese Office Action issued in corresponding Chinese Patent Application No. 202110676723.3 dated Jan. 20, 2022, pp. 1-7.
Russian Office Action issued in corresponding Russian Patent Application No. 202291997 dated Apr. 3, 2023, pp. 1-3.
European Office Action issued in corresponding European Patent Application No. 21814661.1 dated Apr. 16, 2025, pp. 1-9.

* cited by examiner

DISPLAY PANEL, DISPLAY DEVICE, AND DRIVER CHIP

FIELD OF INVENTION

The present disclosure relates to the technical field of display, which particularly relates to a display panel, display device, and driver chip.

BACKGROUND OF INVENTION

With the continuous development of the display market, screens are the most important media for human-computer interaction. Consumers are becoming more and more demanding on the visual effects of the screen, and the requirements for the screen-to-body ratio are getting higher and higher. The full screen is to achieve extremely narrow bezel and maximize the display area through technology, which brings amazing visual effects. In the existing chip on glass (COG) panel technology, the lower bezel of the display panel includes a fan-out wiring area, a driver chip bonding area, and a flexible circuit board bonding area.

The fan-out area and the driver chip bonding area occupy most of the height of the lower bezel. The fan-out area contains signal wires connecting the display area with the driver chip bonding area. With the trend of higher and higher resolution requirements for display panels in the market, the number of signal wires has also increased. As a result, the height of the fan-out area increases or it is difficult to compress the height, which is not conducive to the realization of the full-screen design of the display panel with a narrow bezel.

SUMMARY OF INVENTION

Technical Problems: The present disclosure provides a display panel, display device, and driver chip to realize extremely narrow bezel design.

Technical Solutions: In order to solve the above problem, the technical solutions provided by the present disclosure are as follows:

A first aspect of the present disclosure provides a display panel comprising a display area and a non-display area, wherein a direction from the display area to the non-display area is defined as a first direction and the non-display area comprises:

a bonding area including a first bonding area and a second bonding area arranged along the first direction;

wherein the first bonding area comprises a horizontal bonding area extending along a second direction and a first oblique bonding area, the first oblique bonding area is located at an end of the horizontal bonding area and oblique relative to the horizontal bonding area, and the first direction is perpendicular to the second direction;

the first oblique bonding area comprises a first end connected to the horizontal bonding area and a second end away from the horizontal bonding area; in the second direction, a distance from the second end to the display area is greater than a distance from the first end to the display area, and a projection of the first oblique bonding area on the display area is located outside a projection of the horizontal bonding area on the display area; and the first oblique bonding area comprises a plurality of bonding terminal groups, and the plurality of bonding terminal groups are arranged in a stepped-shape manner at equal intervals or unequal intervals.

In an optional embodiment of the present disclosure, each of the bonding terminal groups comprises a plurality of first bonding terminals; each of the bonding terminal groups comprises a third end and a fourth end; in the second direction, the third end is close to the horizontal bonding area, and the fourth end is away from the horizontal bonding area; the plurality of the first bonding terminals in a same row are arranged obliquely from the fourth end to the third end, and a distance from the third end to the display area is greater than the a distance from the fourth end to the display area.

In an optional embodiment of the present disclosure, the non-display area further comprises a fan-out area, the first bonding area and the second bonding area are located on a side of the fan-out area away from the display area, the first bonding area is located between the fan-out area and the second bonding area, and the fan-out area comprises a plurality of fan-out wires; the horizontal bonding area comprises a plurality of second bonding terminals, and a part of the fan-out wires extend into the first bonding area and are electrically connected to the first bonding terminals and the second bonding terminals, respectively.

In an optional embodiment of the present disclosure, a highest point of an end of each of the bonding terminal groups facing the fan-out area is defined as an apex of the bonding terminal group, a wire connecting an apex of the bonding terminal group at the second end and an apex of the bonding terminal group at the first end forms an oblique angle $\theta_1$ in the second direction, and the oblique angle $\theta_1$ is an obtuse angle.

In an optional embodiment of the present disclosure, $100° \leq \theta_1 \leq 179°$.

In an optional embodiment of the present disclosure, a wire connecting the apices of the first bonding terminals at a same position in the two adjacent bonding terminal groups forms an oblique angle $\theta_2$ in the second direction, and the oblique angle $\theta_2$ is an acute angle.

In an optional embodiment of the present disclosure, $10° \leq \theta_2 \leq 85°$.

In an optional embodiment of the present disclosure, the second bonding area is arranged in an area enclosed by the first oblique bonding area and the horizontal bonding area.

In an optional embodiment of the present disclosure, two adjacent bonding terminal groups are partially overlapped.

In an optional embodiment of the present disclosure, the first bonding terminals in each of the bonding terminal groups are distributed in rows and the first bonding terminals in adjacent rows are arranged alternately.

In an optional embodiment of the present disclosure, the display panel further comprises a second oblique bonding area, and the second oblique bonding area and the first oblique bonding area are arranged axially symmetrically at two ends of the horizontal bonding area.

In an optional embodiment of the present disclosure, the display panel further comprises a driver chip; the driver chip at least comprises a horizontal terminal area and an oblique terminal area, the oblique terminal area is located at an end of the horizontal terminal area and oblique relative to the horizontal terminal area; the oblique terminal area comprises a plurality of first drive terminals, and the plurality of first drive terminals form a plurality of first drive terminal groups; an arrangement of the first drive terminals and the first drive terminal groups is the same as an arrangement of the first bonding terminals and the first bonding terminal groups, and the first drive terminals are electrically connected to the first bonding terminals.

A second aspect of the present disclosure provides a display device comprising a display panel as descried above.

In an optional embodiment of the present disclosure, the display device further comprises:

a flexible circuit board electrically connected to the second bonding area.

A third aspect of the present disclosure provides a driver chip comprising a horizontal terminal area and a first oblique terminal area, wherein the first oblique terminal area is located at an end of the horizontal terminal area and oblique relative to the horizontal terminal area; wherein the first oblique terminal area extends obliquely in a first direction, the horizontal terminal area extends horizontally in a second direction perpendicular to the first direction, and the first oblique terminal area comprises a plurality of first drive terminal groups; the first oblique terminal area comprises a fifth end connected to the horizontal terminal area and a sixth end away from the horizontal terminal area, a projection of the first oblique terminal area on an extended area of the horizontal terminal area is located outside the horizontal terminal area; the plurality of first drive terminal groups are arranged in a stepped-shape manner at equal intervals or unequal intervals.

In an optional embodiment of the present disclosure, each of the first drive terminal groups comprise a plurality of first drive terminals; each of the first drive terminal groups comprises a seventh end and an eighth end; in the second direction, the seventh end is close to the horizontal terminal area and the eighth end is away from the horizontal terminal area; in the first direction, the plurality of first drive terminals in a same row are arranged obliquely from the eighth end to the seventh end, a vertical distance from the seventh end to the extended area of horizontal terminal area is less than a vertical distance from the eighth end to the extended area of the horizontal terminal area.

In an optional embodiment of the present disclosure, a highest point of the eighth end of each of the first drive terminal groups is defined as an apex of the first drive terminal group, a wire connecting an apex of the first drive terminal group at the sixth end and an apex of the first drive terminal group at the fifth end forms an oblique angle in the second direction, and the oblique angle is an obtuse angle and greater than or equal to 100° and less than or equal to 179°.

In an optional embodiment of the present disclosure, a wire connecting the apices of the first drive terminals at a same position in the two adjacent drive terminal groups forms an oblique angle in the second direction, and the oblique angle is an acute angle and greater than or equal to 10° and less than or equal to 85°.

In an optional embodiment of the present disclosure, two adjacent drive terminal groups are partially overlapped, the first drive terminals in each of the first drive terminal groups are distributed in rows, and the first drive terminals in adjacent rows are arranged alternately.

In an optional embodiment of the present disclosure, the driver chip further comprises a second oblique terminal area, and the second oblique terminal area and the first oblique terminal area are arranged axially symmetrically at two ends of the horizontal bonding area.

Beneficial Effects: The beneficial effects of the present disclosure: (1) the present disclosure provides the first and/or second oblique bonding area, the first and/or second oblique bonding area are oblique relative to the horizontal bonding area, and the distance from the second end from the horizontal bonding area to the fan-out area is greater than the distance from the first end of the horizontal bonding area to the fan-out area. A part of each of the fan-out wires may extend into the first bonding area, so that a part of the fan-out area overlaps the bonding area and the height of the fan-out area along the first direction is shortened. The second bonding area is arranged in the area enclosed by the first and/or second oblique bonding area and the horizontal bonding area and the height of the bonding area in the first direction may be shortened. Therefore, the overall height of the fan-out area and the bonding area in the first direction is shortened, and the lower bezel of the display panel may be reduced. Under the premise of meeting the high resolution pursued by the market and not reducing the performance of the driver chip, an extremely narrow bezel design is realized. (2) The first bonding terminals in each row in each of bonding terminal groups are arranged obliquely from the fourth end to the third end, so as to leave more wiring space for the fan-out wiring. The layout design of each structure of the bonding area and the fan-out area is further optimized, thereby improving the space utilization rate of the non-display area and realizing an extremely narrow bezel design. (3) The first and/or second oblique bonding area includes a plurality of bonding terminal groups. The layout design of each structure of the bonding area and the fan-out area may be optimized by adjusting the interval between adjacent bonding terminal groups, and the wire width of the fan-out area wiring may be increased. Therefore, the signal wire impedance is reduced, and the risk of the signal wire being too thin and broken is reduced to achieve a better display effect.

DESCRIPTION OF DRAWINGS

In order to more clearly describe the technical solutions in the embodiments of the present disclosure, the following will briefly introduce the drawings that need to be used in the description of the embodiments. Obviously, the drawings in the following description are only some embodiments of the present disclosure. For those skilled in the art, other drawings can be obtained based on these drawings without creative work.

DETAILED DESCRIPTION OF PREFERRED EMBODIMENTS

Figure 1:
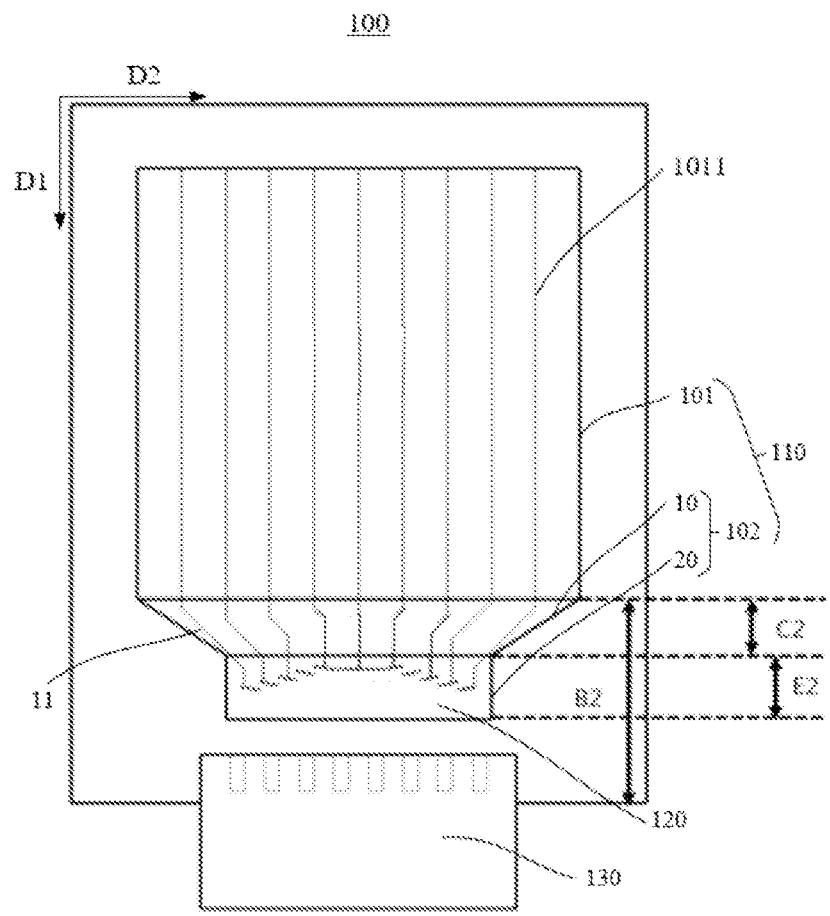
FIG. 1 is a schematic diagram of a planar structure of a display panel according to an embodiment of the present disclosure.

The technical solutions in the embodiments of the present disclosure will be clearly and completely described below in conjunction with the accompanying drawings in the embodiments of the present disclosure. Obviously, the described embodiments are only a part of the embodiments of the present disclosure, rather than all the embodiments. Based on the embodiments of the present disclosure, all other embodiments obtained by those skilled in the art without creative work shall fall within the protection scope of the present disclosure.

In the description of the present disclosure, it should be understood that the directions or positional relationships indicated by the terms "upper", "lower", etc. are based on the directions or positional relationships shown in the drawings and are only for the convenience of describing the present disclosure and simplifying the description. It does not indicate or imply that the pointed device or element must have a specific orientation, be configured, and operated in a specific orientation, and therefore cannot be understood as a limitation of the present disclosure. In addition, the terms "first" and "second" are only used for descriptive purposes and cannot be understood as indicating or implying relative importance or implicitly indicating the number of indicated technical features. Therefore, the features defined with "first" and "second" may explicitly or implicitly include one or more of the features. In the description of the present disclosure, "plurality" means two or more, unless otherwise specifically defined.

The present disclosure may repeat reference numbers and/or reference letters in different implementations. Such repetition is for the purpose of simplification and clarity and does not indicate the relationship between the various embodiments and/or settings discussed.

The fan-out wiring area of the existing high-resolution display panel occupies a large space in the lower bezel of the display panel, which is not conducive to the technical problem of realizing the narrow-bezel full-screen design of the display panel. The present disclosure provides the first and/or second oblique bonding area, the first and/or second oblique bonding area are oblique relative to the horizontal bonding area, and the distance from the second end from the horizontal bonding area to the fan-out area is greater than the distance from the first end of the horizontal bonding area to the fan-out area. A part of each of the fan-out wires may extend into the first bonding area, so that a part of the fan-out area overlaps the bonding area and the height of the fan-out area along the first direction is shortened. The second bonding area is arranged in the area enclosed by the first and/or second oblique bonding area and the horizontal bonding area and the height of the bonding area in the first direction may be shortened. Therefore, the overall height of the fan-out area and the bonding area in the first direction is shortened, and the lower bezel of the display panel may be reduced. Under the premise of meeting the high resolution pursued by the market and not reducing the performance of the driver chip, an extremely narrow bezel design is realized. The first bonding terminals in each row in each of bonding terminal groups are arranged obliquely from the fourth end to the third end, so as to leave more wiring space for the fan-out wiring. The layout design of each structure of the bonding area and the fan-out area is further optimized, thereby improving the space utilization rate of the non-display area and realizing an extremely narrow bezel design. The first and/or second oblique bonding area includes a plurality of bonding terminal groups. The layout design of each structure of the bonding area and the fan-out area may be optimized by adjusting the interval between adjacent bonding terminal groups, and the wire width of the fan-out area wires may be increased. Therefore, the signal wire impedance is reduced, and the risk of the signal wire being too thin and broken is reduced to achieve a better display effect.

The display panel, display device, and driver chip of the present disclosure are described in detail below in conjunction with specific embodiments.

Referring to FIG. 1, a first embodiment of the present disclosure provides a display device 100 including a display panel 110, at least one driver chip 120, and at least one flexible circuit board 130. The driver chip 120 is formed on the display panel 110 and is electrically connected to the display panel 110, and the flexible circuit board 130 is located on a side of the display panel 110 and is electrically connected to the display panel 110.

Wherein the display panel 110 includes a display area 101 and a non-display area 102 surrounding the display area 101.

Wherein, a direction defined from the display area 101 to the non-display area 102 is a first direction D1. The display area 101 includes a plurality of signal wires 1011 extending along the first direction D1 and arranged along the second direction D2. The first direction D1 is perpendicular to the second direction D2.

Wherein, the signal wires 1011 may be a data line for charging pixels (not shown) in the display area 101 or one or two of touch signal wires connected to a touch sensor in the display area 101.

Wherein, the non-display area 102 includes a fan-out area 10 and a bonding area 20. The bonding area 20 is located on a side of the fan-out area 10 away from the display area 101.

Wherein, the fan-out area 10 includes a plurality of fan-out wires 11 extending along the first direction D1 as a whole and arranged along the second direction D2. One end of each of fan-out wires 11 is electrically connected to the corresponding signal wires 1011.

Figure 2:
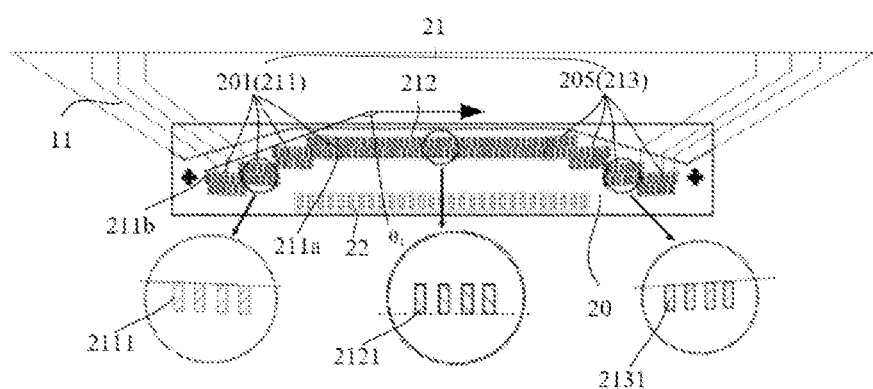
FIG. 2 is a schematic diagram of the planar structure of a bonding area and a fan-out area of the display panel shown in FIG. 1.

Referring to FIG. 2, the bonding area 20 includes a first bonding area 21 and a second bonding area 22, and the first bonding area 21 and the second bonding area 22 are arranged along the first direction D1. Specifically, the first bonding area 21 is adjacent to the fan-out area 10, and the second bonding area 22 is away from the fan-out area 10.

Wherein, the first bonding area 21 includes a first oblique bonding area 211 and a second oblique bonding area 213. The first oblique bonding area 211 and the second oblique bonding area 213 extend along the horizontal bonding area 212 along the second direction D2 and are located at the end of the horizontal bonding area 212. Specifically, the first oblique bonding area 211 and the second oblique bonding area 213 are axially symmetrically arranged at two ends of the horizontal bonding area 212.

The first oblique bonding area 211 includes a first end 211a connected to the horizontal bonding area 212 and a second end 211b away from the horizontal bonding area 212. In the second direction D2, the distance from the second end 211b to the display area 101 is greater than the distance from the first end 211a to the display area 101. a projection of the first oblique bonding area 211 on the display area 101 is located outside a projection of the horizontal bonding area 212 on the display area 101. Therefore, a part of each of fan-out wires 11 may extend into the first bonding area 21, so that a part of the fan-out area 10 overlaps the bonding area 20, and the height of the fan-out area 10 in the first direction D1 is shortened. The overall height of the fan-out area 10 and the bonding area 20 in the first direction D1 is shortened, so that the lower bezel of the display panel 110 may be reduced. Under the premise of meeting the high resolution pursued by the market and not reducing the performance of the driver chip, an extremely narrow bezel design is realized.

In an optional embodiment of the present disclosure, the second bonding area 22 is arranged in an area enclosed by the first inclined bonding area 211, the second oblique bonding area 213, and the horizontal bonding area 212. Thus, the layout of the first bonding area 21 and the second bonding area 22 in the bonding area 20 may be achieved.

In other embodiments, the first bonding area 21 may also not include the second oblique bonding zone 213. In this case, the second bonding area 22 is arranged in an area enclosed by the first oblique bonding area 211 and the horizontal bonding area 212.

Figure 3:
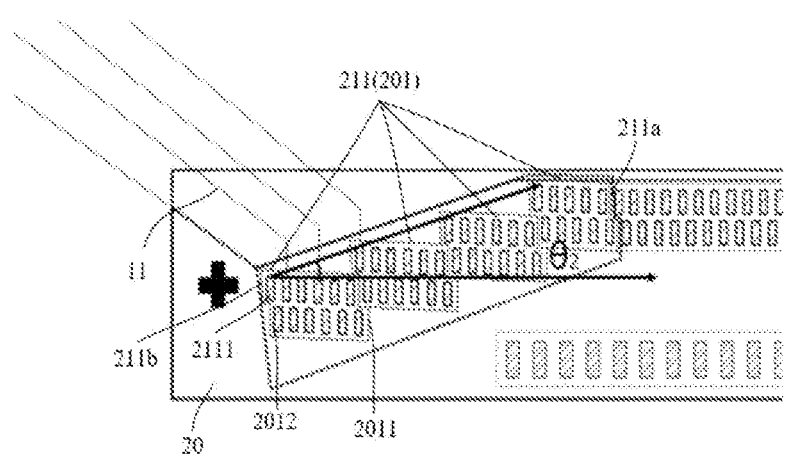
FIG. 3 is a partial enlarged view of the structure in the bonding area and the fan-out area of the display area shown in FIG. 2.
Figure 4:
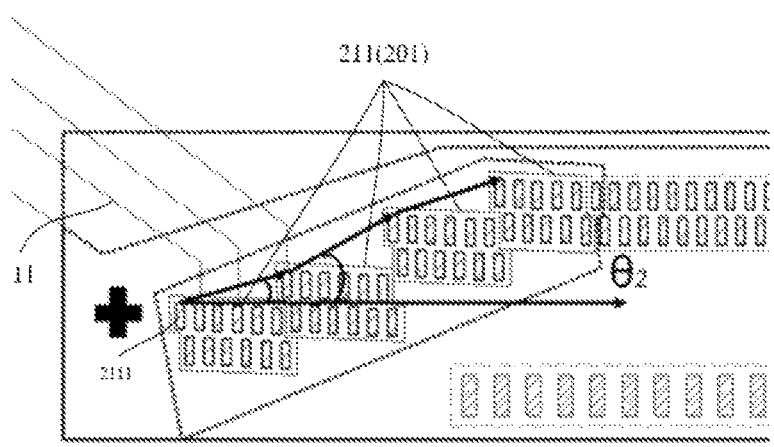
FIG. 4 is a partial enlarged view of the structure in the bonding area and the fan-out area of the display area according to another display panel of the present disclosure.

Referring to FIG. 2 to FIG. 4, the first oblique bonding area 211 includes a plurality of bonding terminal groups arranged in a stepped-shape manner. In this case, the layout design of each structure of the bonding area and the fan-out area may be optimized by adjusting the interval between adjacent bonding terminal groups. It is also possible to increase the wires width of the wires in the fan-out area, thereby reducing the impedance of the signal wire, and reducing the risk of the signal wire being too thin and broken, so as to achieve a better display effect.

Each of the bonding terminal groups includes a plurality of first bonding terminals 2111. The first bonding terminals 2111 in each of the bonding terminal groups are distributed in rows, and the first bonding terminals 2111 in adjacent rows are arranged alternately. The horizontal bonding area 212 includes a plurality of second bonding terminals 2121. The second bonding terminals 2121 are arranged in rows and the second bonding terminals 2121 are arranged horizontally in each of rows. The second bonding terminals 2121 in two adjacent rows are arranged alternately. A part of the fan-out wires 11 extend into the first bonding area 21 and are electrically connected to the first bonding terminal 2111 and the second bonding terminal 2121 respectively.

Referring to FIG. 2 and FIG. 3, in an optional embodiment of the present disclosure, a plurality of the bonding terminal groups are arranged in a stepped-shape manner at equal intervals in the second direction D2.

Referring to FIG. 4, in an optional embodiment of the present disclosure, a plurality of the bonding terminal groups are arranged in a stepped-shape manner at unequal intervals in the second direction D2.

The plurality of bonding terminal groups may also be arranged at equal intervals or unequal intervals in the first direction D1.

Referring to FIG. 2 to FIG. 4, in an optional embodiment of the present disclosure, two adjacent bonding terminal groups may partially overlap. In another optional embodiment of the present disclosure, two adjacent bonding terminal groups may not overlap.

Referring FIG. 2, a highest point of an end of each of the bonding terminal groups facing the fan-out area 10 is defined as an apex of the bonding terminal group, a wire connecting an apex of the bonding terminal group at the second end 211b and an apex of the bonding terminal group at the first end forms an oblique angle $\theta_1$ in the second direction D2, and the oblique angle $\theta_1$ is an obtuse angle. Preferably, $100° \leq \theta_1 \leq 179°$.

Referring to FIG. 3 and FIG. 4, a wire connecting the apices of the first bonding terminals at a same position in the two adjacent bonding terminal groups forms an oblique angle $\theta_2$ in the second direction, and the oblique angle $\theta_2$ is an acute angle. Preferably, $10° \leq \theta_2 \leq 85°$.

Specifically, in FIG. 3, since the plurality of the bonding terminal groups are arranged in the stepped-shape manner at equal intervals in the second direction D2, the oblique angle $\theta_2$ of the wire connecting the apex centers of the first bonding terminals at the same position in the two adjacent bonding terminal groups in the second direction D2 is equal.

Specifically, in FIG. 4, since the plurality of the bonding terminal groups are arranged in the stepped-shape manner at unequal intervals in the second direction D2, the oblique angle $\theta_2$ of the wire connecting the apex centers of the first bonding terminals at the same position in the two adjacent bonding terminal groups in the second direction D2 may not be equal, or one part of them may be equal and the other part may be unequal.

Specifically, refer to FIG. 2 to FIG. 4, in the embodiment, the first oblique bonding area 211 includes four first bonding terminal groups 201.

The following will take the first bonding terminal groups 201 as an example to specifically describe the arrangement of the first bonding terminals 2111 in each of bonding terminal groups.

Specifically, refer to FIG. 3, each of the bonding terminal groups 201 comprises a third end 2011 and a fourth end 2012. In the second direction D2, the third end 2011 is close to the horizontal bonding area 212. The fourth end 2012 is away from the horizontal bonding area 212. In the first direction D1, a distance from the third end 2011 to the display area 101 is greater than a distance from the fourth end 2012 to the display area 101. The plurality of the first bonding terminals 2111 in a same row are arranged obliquely from the fourth end 2012 to the third end 2011. The first bonding terminals 2111 of the first bonding terminal group 201 are distributed in two rows and the first bonding terminals 2111 in the first row and the first bonding terminals 2111 in the second row are alternately arranged. That is, one of the first bonding terminals 2111 in the second row faces the gap between the two first bonding terminals 2111 in the first row.

Referring to FIG. 2, the second oblique bonding area 213 includes a plurality of second bonding terminal groups 205. Each of the second bonding terminal groups 205 includes a plurality of third bonding terminals 2131. The plurality of third bonding terminals 2131 are distributed in rows, and the third bonding terminals 2131 in adjacent rows are arranged alternately.

Figure 5:
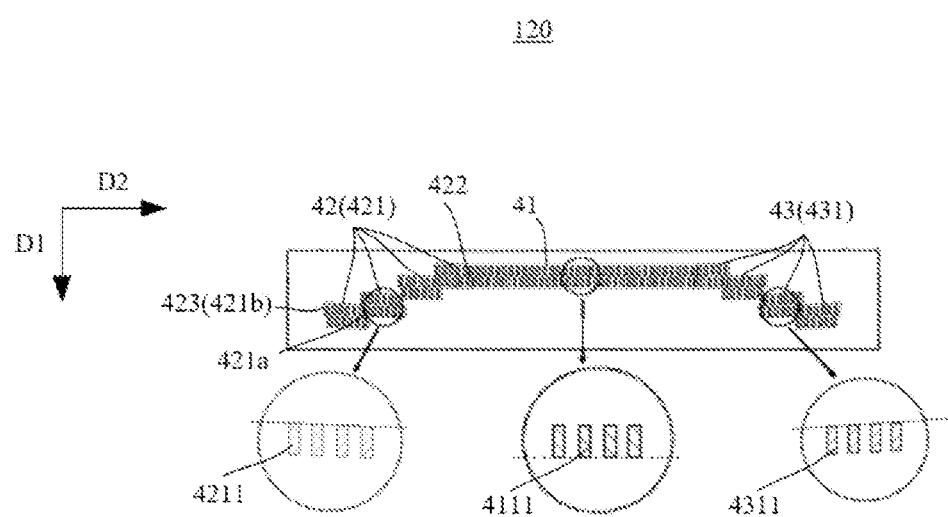
FIG. 5 is a schematic diagram of a planar structure according to a driver chip of the present disclosure.

Referring to FIG. 1 and FIG. 5, The driver chip 120 at least includes a horizontal terminal area 41, a first oblique terminal area 42, and a second oblique terminal area 43, wherein the first oblique terminal area 42 and the second oblique terminal area 43 are located at an end of the horizontal terminal area 41 and oblique relative to the horizontal terminal area 41. The first oblique terminal area 42 and the second oblique terminal area 43 extend obliquely along the first direction D1. The horizontal terminal area 41 extends horizontally along the second direction D2 perpendicular to the first direction D1. The second oblique terminal area 43 and the first oblique terminal area 42 are axially symmetrically arranged at two ends of the horizontal terminal area 41.

The first oblique terminal area 42 includes a fifth end 422 connected to the horizontal terminal area 41 and a sixth end 423 away from the horizontal terminal area 41. In the first direction D1, a projection of the first oblique terminal area 42 on an extended area of the horizontal terminal area 41 is located outside the horizontal terminal area 41. The plurality of first drive terminal groups 421 are arranged in a stepped-shape manner at equal intervals or unequal intervals.

The first oblique terminal area 42 includes a plurality of first drive terminal groups 421, and each of the first drive terminal groups 421 includes a plurality of first drive terminals 4211. The horizontal terminal area 41 includes a plurality of second drive terminals 4111. The second oblique terminal area 43 includes a plurality of third drive terminal groups 431. Each of the second drive terminal groups 431 includes a plurality of third drive terminals 4311. The first drive terminal 4211, the second drive terminal 4111, and the third drive terminal 4311 are electrically connected to the first bonding terminal 2111, the second bonding terminal 2121, and the third bonding terminal 2131, respectively.

Each of the first drive terminal groups 421 comprises a seventh end 421*a* and an eighth end 421*b*. In the second direction D2, the seventh end 421*a* is close to the horizontal terminal area 41 and the eighth end 421*b* is away from the horizontal terminal area 41. In the second direction D2, the plurality of first drive terminals 4211 in a same row are arranged obliquely from the eighth end 421*b* to the seventh end 421*a*. A vertical distance from the seventh end 421*a* to the extended area of horizontal terminal area 41 is less than a vertical distance from the eighth end 421*b* to the extended area of the horizontal terminal area 41.

A highest point of the eighth end 421*b* of each of the first drive terminal groups 421 is defined as an apex of the first drive terminal group 421, a wire connecting an apex of the first drive terminal group 421 at the sixth end 423 and an apex of the first drive terminal group 421 at the fifth end 422 forms an oblique angle in the first direction D1, and the oblique angle is an obtuse angle and greater than or equal to 100° and less than or equal to 179°.

A wire connecting the apices of the first drive terminals 4211 at a same position in the two adjacent drive terminal groups 421 forms an oblique angle in the second direction D2, and the oblique angle is an acute angle and greater than or equal to 10° and less than or equal to 85°.

Two adjacent first drive terminal groups 421 are partially overlapped, the first drive terminals 4211 in each of the first drive terminal groups 421 are distributed in rows, and the first drive terminals 4211 in adjacent rows are arranged alternately.

The second oblique terminal area 43 includes a plurality of third drive terminals 4311. The plurality of third drive terminals 4311 are distributed in rows, and the third drive terminals 4311 in adjacent rows are arranged alternately.

The beneficial effects of the present disclosure: (1) the present disclosure provides the first and/or second oblique bonding area, the first and/or second oblique bonding area are oblique relative to the horizontal bonding area, and the distance from the second end from the horizontal bonding area to the fan-out area is greater than the distance from the first end of the horizontal bonding area to the fan-out area. A part of each of the fan-out wires may extend into the first bonding area, so that a part of the fan-out area overlaps the bonding area and the height of the fan-out area along the first direction is shortened. The second bonding area is arranged in the area enclosed by the first and/or second oblique bonding area and the horizontal bonding area and the height of the bonding area in the first direction may be shortened. Therefore, the overall height of the fan-out area and the bonding area in the first direction is shortened, and the lower bezel of the display panel may be reduced. Under the premise of meeting the high resolution pursued by the market and not reducing the performance of the driver chip, an extremely narrow bezel design is realized. (2) The first bonding terminals in each row in each of bonding terminal groups are arranged obliquely from the fourth end to the third end, so as to leave more wiring space for the fan-out wiring. The layout design of each structure of the bonding area and the fan-out area is further optimized, thereby improving the space utilization rate of the non-display area and realizing an extremely narrow bezel design. (3) The first and/or second oblique bonding area includes a plurality of bonding terminal groups. The layout design of each structure of the bonding area and the fan-out area may be optimized by adjusting the interval between adjacent bonding terminal groups, and the wire width of the fan-out area wiring may be increased. Therefore, the signal wire impedance is reduced, and the risk of the signal wire being too thin and broken is reduced to achieve a better display effect. (4) The second bonding area is arranged in an area enclosed by the first and/or second oblique bonding area and the horizontal bonding zone. The layout of the first bonding area and the second bonding area in the bonding area may be optimized In summary, although the present disclosure has been disclosed as above in preferred embodiments, said preferred embodiments are not intended to limit the present disclosure. Those of ordinary skill in the art may make various changes and modifications without departing from the spirit and scope of the present disclosure. Therefore, the protection scope of the present disclosure is subject to the scope defined by the claims.

What is claimed is:

1. A display panel, comprising a display area and a non-display area, wherein a direction from the display area to the non-display area is defined as a first direction and the non-display area comprises:
   a bonding area including a first bonding area and a second bonding area arranged along the first direction;
   wherein the first bonding area comprises a horizontal bonding area extending along a second direction and a first oblique bonding area, the first oblique bonding area is located at an end of the horizontal bonding area and oblique relative to the horizontal bonding area, and the first direction is perpendicular to the second direction;
   wherein the first oblique bonding area comprises a first end connected to the horizontal bonding area and a second end away from the horizontal bonding area; in the second direction, a distance from the second end to the display area is greater than a distance from the first end to the display area, and a projection of the first oblique bonding area on the display area is located outside a projection of the horizontal bonding area on the display area;
   wherein the first oblique bonding area comprises a plurality of bonding terminal groups, and the plurality of bonding terminal groups are arranged in a stepped-shape manner at equal intervals or unequal intervals; and
   wherein each of the bonding terminal groups comprises a plurality of first bonding terminals; each of the bonding terminal groups comprises a third end and a fourth end; in the second direction, the third end is close to the horizontal bonding area, and the fourth end is away from the horizontal bonding area; the plurality of the first bonding terminals in a same row are arranged obliquely from the fourth end to the third end, and a distance from the third end to the display area is greater than a distance from the fourth end to the display area.

2. The display panel according to claim 1, wherein the non-display area further comprises a fan-out area, the first bonding area and the second bonding area are located on a side of the fan-out area away from the display area, the first bonding area is located between the fan-out area and the second bonding area, and the fan-out area comprises a plurality of fan-out wires; the horizontal bonding area comprises a plurality of second bonding terminals, and a part of the fan-out wires extend into the first bonding area and are electrically connected to the first bonding terminals and the second bonding terminals, respectively.

3. The display panel according to claim 2, wherein a highest point of an end of each of the bonding terminal groups facing the fan-out area is defined as an apex of the bonding terminal group, a wire connecting an apex of the bonding terminal group at the second end and an apex of the bonding terminal group at the first end forms an oblique angle θ1 in the second direction, and the oblique angle θ1 is an obtuse angle.

4. The display panel according to claim 2, wherein $100° \leq \theta1 \leq 179°$.

5. The display panel according to claim 1, wherein a wire connecting the apices of the first bonding terminals at a same position in the two adjacent bonding terminal groups forms an oblique angle θ2 in the second direction, and the oblique angle θ2 is an acute angle.

6. The display panel according to claim 5, wherein $10° \leq \theta2 \leq 85°$.

7. The display panel according to claim 1, wherein the second bonding area is arranged in an area enclosed by the first oblique bonding area and the horizontal bonding area.

8. The display panel according to claim 1, wherein two adjacent bonding terminal groups are partially overlapped.

9. The display panel according to claim 1, wherein first bonding terminals in each of the bonding terminal groups are distributed in rows and the first bonding terminals in adjacent rows are arranged alternately.

10. The display panel according to claim 1, wherein the display panel further comprises a second oblique bonding area, and the second oblique bonding area and the first oblique bonding area are arranged axially symmetrically at two ends of the horizontal bonding area.

11. The display panel according to claim 1, wherein the display panel further comprises a driver chip;
the driver chip at least comprises a horizontal terminal area and an oblique terminal area, the oblique terminal area is located at an end of the horizontal terminal area and oblique relative to the horizontal terminal area; the oblique terminal area comprises a plurality of first drive terminals, and the plurality of first drive terminals form a plurality of first drive terminal groups; an arrangement of the first drive terminals and the first drive terminal groups is the same as an arrangement of the first bonding terminals and the first bonding terminal groups, and the first drive terminals are electrically connected to the first bonding terminals.

12. A display device, comprising:
a display panel of claim 1.

13. The display device according to claim 12, wherein the display device further comprises a flexible circuit board electrically connected to the second bonding area.

14. A driver chip, comprising:
a horizontal terminal area and a first oblique terminal area, wherein the first oblique terminal area is located at an end of the horizontal terminal area and oblique relative to the horizontal terminal area;
wherein the first oblique terminal area extends obliquely in a first direction, the horizontal terminal area extends horizontally in a second direction perpendicular to the first direction, and the first oblique terminal area comprises a plurality of first drive terminal groups;
wherein the first oblique terminal area comprises a fifth end connected to the horizontal terminal area and a sixth end away from the horizontal terminal area, a projection of the first oblique terminal area on an extended area of the horizontal terminal area is located outside the horizontal terminal area; the plurality of first drive terminal groups are arranged in a stepped-shape manner at equal intervals or unequal intervals; and
wherein each of the first drive terminal groups comprise a plurality of first drive terminals; each of the first drive terminal groups comprises a seventh end and an eighth end; in the second direction, the seventh end is close to the horizontal terminal area and the eighth end is away from the horizontal terminal area; in the first direction, the plurality of first drive terminals in a same row are arranged obliquely from the eighth end to the seventh end, a vertical distance from the seventh end to the extended area of horizontal terminal area is less than a vertical distance from the eighth end to the extended area of the horizontal terminal area.

15. The driver chip according to claim 14, wherein a highest point of the eighth end of each of the first drive terminal groups is defined as an apex of the first drive terminal group, a wire connecting an apex of the first drive terminal group at the sixth end and an apex of the first drive terminal group at the fifth end forms an oblique angle in the second direction, and the oblique angle is an obtuse angle and greater than or equal to 100° and less than or equal to 179°.

16. The driver chip according to claim 14, wherein a wire connecting the apices of the first drive terminals at a same position in the two adjacent drive terminal groups forms an oblique angle in the second direction, and the oblique angle is an acute angle and greater than or equal to 10° and less than or equal to 85°.

17. The driver chip according to claim 14, wherein two adjacent first drive terminal groups are partially overlapped, the first drive terminals in each of the first drive terminal groups are distributed in rows, and the first drive terminals in adjacent rows are arranged alternately.

18. The driver chip according to claim 14, wherein the driver chip further comprises a second oblique terminal area, and the second oblique terminal area and the first oblique terminal area are arranged axially symmetrically at two ends of the horizontal bonding area.

* * * * *